United States Patent
Kusuura (10) Patent No.: US 8,530,402 B2
(45) Date of Patent: Sep. 10, 2013

(54) CLEANING SOLVENT WITH NANOFABRICATED PARTICLES

(75) Inventor: Takahisa Kusuura, Kanagawa (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/445,254

(22) Filed: Apr. 12, 2012

(65) Prior Publication Data

US 2012/0196786 A1 Aug. 2, 2012

Related U.S. Application Data

(63) Continuation of application No. 13/119,731, filed as application No. PCT/JP2010/070634 on Nov. 12, 2010, now Pat. No. 8,177,913.

(51) Int. Cl.
*C11D 7/50* (2006.01)
*C11D 7/24* (2006.01)

(52) U.S. Cl.
USPC ............ 510/407; 510/418; 510/171; 510/175

(58) Field of Classification Search
USPC .................................. 510/407, 418, 171, 175
See application file for complete search history.

(56) References Cited

U.S. PATENT DOCUMENTS

| | | | | |
|---|---|---|---|---|
| 3,827,248 | A * | 8/1974 | Graniaris | 62/123 |
| 3,879,956 | A * | 4/1975 | Ganiaris | 62/123 |
| 5,342,546 | A | 8/1994 | Sato et al. | |
| 6,488,779 | B1 | 12/2002 | Lohmüller | |
| 6,875,286 | B2 | 4/2005 | Cotte et al. | |
| 2008/0119828 | A1 | 5/2008 | Nelson et al. | |
| 2009/0001316 | A1* | 1/2009 | Hassan et al. | 252/182.12 |
| 2009/0029146 | A1* | 1/2009 | Holmes et al. | 428/317.9 |
| 2010/0055029 | A1* | 3/2010 | Ahn | 423/648.1 |

FOREIGN PATENT DOCUMENTS

| | | |
|---|---|---|
| AT | 275004 T | 9/2004 |
| DE | 19916345 A1 | 10/2000 |
| EP | 1169145 A1 | 1/2002 |
| JP | 2002329700 A | 11/2002 |
| JP | 2002540939 A | 12/2002 |
| JP | 2003303799 A | 10/2003 |
| JP | 2008006442 A | 1/2008 |
| JP | 2008064827 A | 3/2008 |
| JP | 2008281332 A | 11/2008 |
| WO | WO 00/61306 A1 | 10/2000 |

OTHER PUBLICATIONS

International Search Report and Written Opinion for PCT/JP2010/070634, dated Feb. 22, 2011.
Automated Cleaning Technology Increases Device Reliability for MEMS Industry, http://azonano.com/news.aspx?newsiD=6763 (Jul. 8, 2008).
File: Atmospheric Transmission.png—Global Warming Art, http://en.wikipedia.org/wiki/File:Atmospheric_Transmission.png (Printed from Internet Oct. 1, 2012).
Bematek: New High-Shear Colloid Mills, http://www.bematek.com/files/CM-GenIntro.pdf (Printed from Internet Jul. 31, 2012).
Butane, http://en.wikipedia.org/wiki/Butane (Printed from Internet Jul. 31, 2012).
Carbon Dioxide Snow Cleaning, http://www.co2clean.com (Printed from Internet Jul. 31, 2012).
Marshall et al., Natural Convection Supercritical Fluid Cleaning Applications, http://infohouse/p2ric.org/ref/02/01735.pdf (Printed from Internet Oct. 2, 2012).
MCK et al., One Company's Approach Semiconductor Equipment Parts Cleaning, Cleaning in Practice, http://infohouse/p2ric.org/ref/01/00888.pdf (Printed from Internet Oct. 2, 2012).
MTechnique: Top emulsion technology, http://www.m-technique.co.jp (Printed from Internet Jul. 31, 2012).
Cool the Liquid Xenon: News@KEK, http://www.kek.jp/newskek/2005/janfeb/MEGXePT.html (Jan. 20, 2005).
Pentane, http://en.wikipedia.org/wiki/Pentane (Printed from Internet Jul. 31, 2012).
Propane, http://en.wikipedia.org/wiki/Propane (Printed from Internet Jul. 31, 2012).
Quinone, http://en.wikipedia.org/wiki/Quinone (Printed from Internet Jul. 31, 2012).
Triple Point, http://en.wikipedia.org/wiki/Triple_Point_Of_Water (Printed from Internet Jul. 31, 2012).
Xenon, http://en.wikipedia.org/wiki/Xenon (Printed from Internet Jul. 31, 2012).
Schutte et al., Weak ice absorption features at 7.24 and 7.41 μm in the spectrum of the obscured young stellar object W 33A, *Astron. Astrophys.* (1999), 343:966-976.
Yagyu et al., Micropowder blasting with nanoparticles dispersed polymer mask for rapid phototyping of glass chip, *J. Micromech. Microeng.* (Apr. 29, 2005), 15:1236-1241.

* cited by examiner

*Primary Examiner* — Lorna M Douyon
(74) *Attorney, Agent, or Firm* — Pepper Hamilton LLP (57) ABSTRACT

A cleaning apparatus comprises a container configured to hold an article to be cleaned, a cleaning solvent dispenser configured to supply a cleaning solvent to the container, an energy generator configured to provide thermal energy to an interior of the container; and a control device in communication with the energy generator and configured to select thermal energy sufficient to sublimate the particles. The cleaning solvent comprises a solvent and nanofabricated particles dispersed therein. The control device controls the energy generator to provide thermal energy to the cleaning solvent in container in which the article is submerged in order to cause sublimation of the particles.

14 Claims, 10 Drawing Sheets

CLEANING SOLVENT WITH NANOFABRICATED PARTICLES

This is application is a continuation application of U.S. application Ser. No. 13/119,731, filed on Mar. 18, 2011, now U.S. Pat. No. 8,177,913, which is a national stage entry of PCT/JP2010/070634, filed Nov. 12, 2010, both of which are incorporated by reference.

BACKGROUND

Nanoimprint lithography has attracted growing attention in recent years as the integration of semiconductor devices increases or various devices become more miniaturized. The nanoimprint lithography provides a method of forming nanometer-sized patterns. Typically, in nanoimprint lithography, a template (mold), which has predetermined topological patterns, is pressed onto a silicon wafer on which an imprint resist is provided, thereby transferring the patterns in the imprint resist on the silicon wafer. By way of this, patterns can be transferred with a high accuracy of size control and with an excellent reproducibility of pattern designs.

Accordingly, even a very small contaminant adhering to the mold would cause the resulting pattern to undesirably contain the shape of the contaminant, which results in defects in the pattern. In order to improve the yield of semiconductor devices and ensure a high reliability thereof, molds need to be cleaned so as to be free from the adhesion of contaminants.

One of potential methods of cleaning molds would be ultrasonic cleaning. However, in ultrasonic cleaning, generated ultrasonic cavitation itself as well as vibration of removed contaminant particles might damage the surface of a mold having nanofabricated patterns. Another potential method would be a method of removing contaminant particles by dissolving the contaminant particles with an acid or alkali solution. However this method requires the selection of a solution that does not react with an object to be cleaned, and thus such a method is not widely applicable.

DETAILED DESCRIPTION

Reference will now be made in detail to embodiments, examples of which are illustrated in the accompanying drawings. The drawings are intended to be explanatory and may not be drawn to scale. In the following detailed description, numerous specific details are set forth in order to provide a thorough understanding of the present invention. However, it will be apparent to one of ordinary skill in the art that the present disclosure may be practiced without these specific details. In other instances, well-known methods, procedures, components, and circuits have not been described in detail so as not to unnecessarily obscure aspects of the embodiments.

Figure 1:
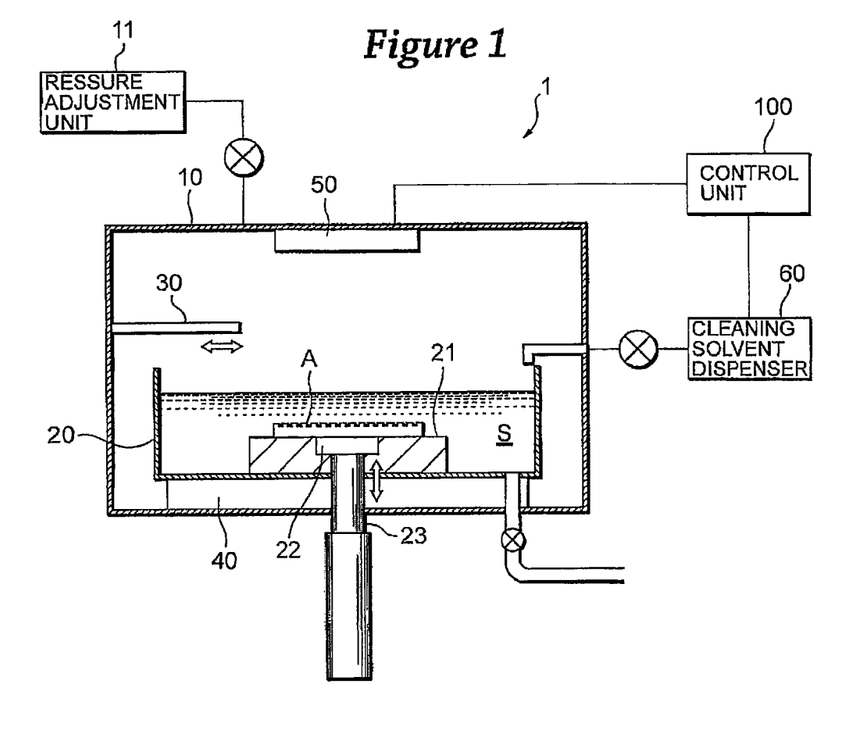
FIG. 1 is a schematic illustration of an example of a cleaning apparatus arranged in accordance with the present disclosure.

FIG. 1 is a schematic illustration of an example of a cleaning apparatus arranged in accordance with the present disclosure. As shown in FIG. 1, a cleaning apparatus 1 comprises a chamber 10, a container 20, a conveying arm 30, a temperature maintaining device 40, an energy generator. 50, and a cleaning solvent dispenser 60. Further, the cleaning apparatus 1 comprises a control unit 100 configured to control various electronically-driven devices arranged in the cleaning apparatus 1.

The chamber 10 is configured to adjust and maintain its internal pressure at a predetermined level. In an example, the internal pressure of the chamber 10 may be at the atmospheric pressure (i.e., 1 atm). In another example, the internal pressure of the chamber 10 may be at a vacuum pressure of about 0.06 atm or lower. The internal pressure of the chamber 10 may be adjusted and maintained in accordance with a sublimation point of particles dispersed in a solvent, as will be explained later. The internal pressure of the chamber 10 may be adjusted and maintained by a pressure adjustment unit 11.

The container 20 is configured to hold a cleaning solvent S in a continuous liquid medium. The cleaning solvent S comprises a solvent with nanometer-sized particles dispersed therein. Thus, the cleaning solvent S may refer to as a sol or colloid. In the present disclosure, the cleaning solvent S comprises liquid butane serving as a solvent and nanometer-sized particles of carbon dioxide in a solid phase (i.e., nanoparticulated dry ice) which are dispersed therein. The container 20 includes a stage 21 on which an article A to be cleaned, such as a semiconductor wafer, an MEMS device, or a template, is placed. The article A may have nanofabricated patterns on a surface thereof. The stage 21 may be configured to include a movable chuck 22 for chucking the article A. The movable chuck 22 is configured to move up and down with its extensible shaft 23.

The conveying arm 30 is configured to convey the article A from/to the inside of the chamber 10. The article A which has been conveyed to a predetermined position in the chamber 10 by the conveying arm 30 is picked up and placed on the stage 21 by the movable chuck 22. A surface to be cleaned of the article A may be directed upward in order that the particles dispersed in the solvent are easily introduced into the structure of nanofabricated patterns on the surface of the article A.

The temperature maintaining device 40 is disposed at, but not limited to, the bottom of the container 20. The temperature maintaining device 40 is configured to adjust and maintain the cleaning solvent S in the container 20 at a predetermined temperature. The cleaning solvent S may be adjusted and maintained at a temperature slightly below the sublimation point of the particles. For example, where the dispersing particles are dry ice whose sublimation point is about −78.5 degrees Celsius under a pressure of 1 atm, the cleaning solvent may be at a temperature of about −80 degrees Celsius, which is slightly below the sublimation point of the dry ice.

The energy generator 50 is configured to provide external energy (e.g., thermal energy) to the particles dispersed in the solvent in the container 20. Power of the energy generator 50 is selected by the control unit 100 such that the sublimation of the particles of dry ice can be induced. Since the cleaning solvent S is adjusted and maintained at the temperature slightly below the sublimation point of the particles as explained above, the energy generator 50 may allow the particles to sublimate with relatively-low thermal energy. The energy generator 50 may provide the thermal energy continuously or periodically to cause the particles to sublimate. In an example, the energy generator 50 may comprise a thermalelectric element or heater, or an electromagnetic radiation emitter. In another example, the energy generator 50 may comprise an infrared laser. It should be understood that carbon dioxide can absorb radiation in infrared radiation wavelengths. Thus, when using an infrared laser, materials that do not infrared radiation may be selected as the solvent.

The cleaning solvent dispenser 60 is configured to supply the cleaning solvent S, which comprises the solvent with the nanometer-sized particles dispersed therein, into the container 20. In an example, the solvent is liquid butane, whereas the particles are carbon dioxide in a solid phase. Since carbon dioxide is nonpolar molecule, aggregation of the molecule hardly occurs. The cleaning solvent dispenser 60 may produce nanometer-sized ultrafine particles by crushing or milling coarse particles premixed in the solvent while being cooled. It should be noted that not all the particles have to be formed uniformly in a nanometer size, and it is only necessary that the cleaning solvent S contains a sufficient amount of particles that are sufficiently small to be introduced into the structure of the fine patterns on the surface of the article. In an example, Ultrafine grinder/SS5 produced by M Technique Co., Ltd. may be used. This product allows particles to be nanoparticulated by a high-speed shearing force in a boundary layer of fluid. Alternatively, High-Shear colloid mills produced by Bematek systems, Inc. may be used.

Figure 2:
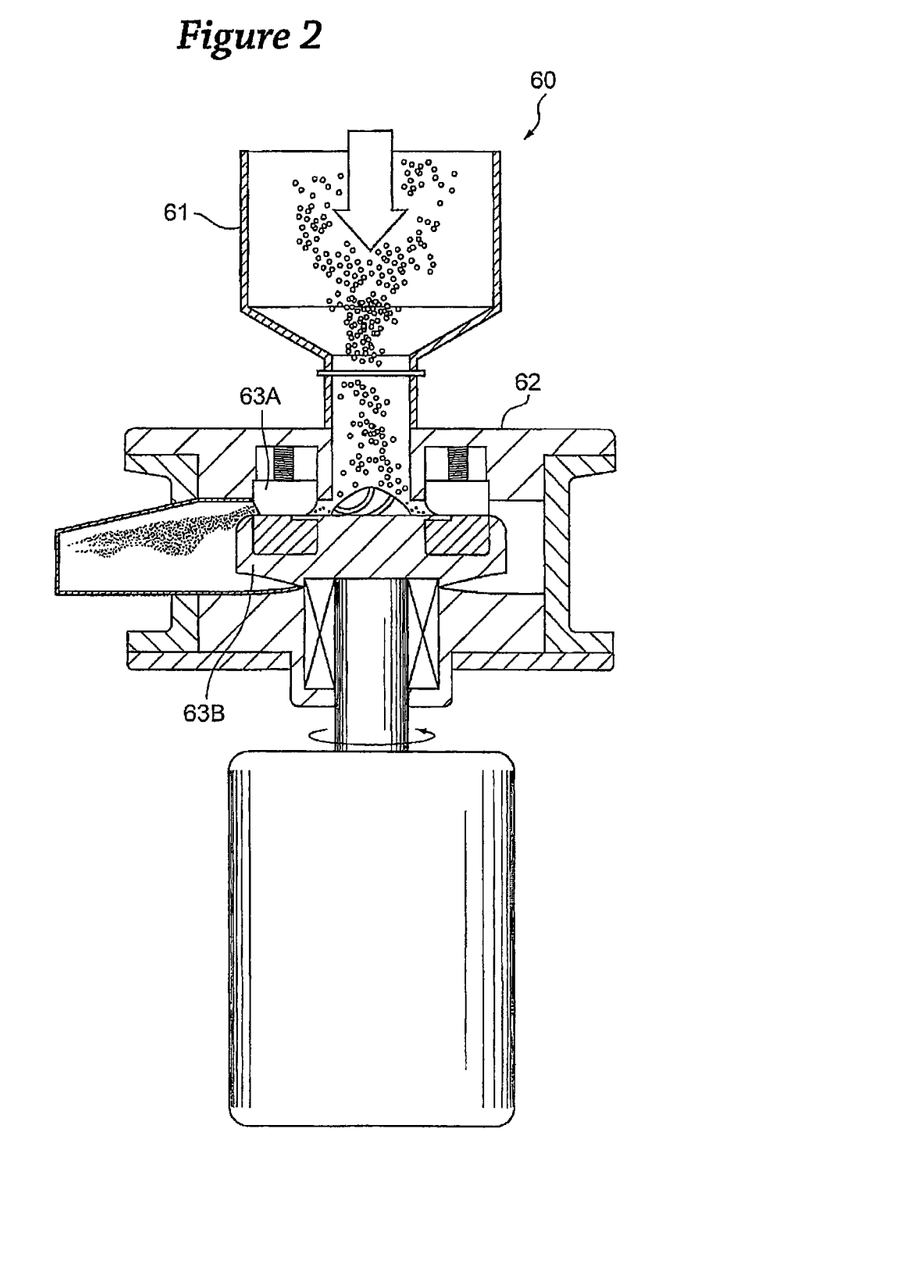
FIG. 2 is a schematic illustration of an example of a cleaning solvent dispenser of the cleaning apparatus arranged in accordance with the present disclosure.

FIG. 2 is a schematic illustration of an example of the cleaning solvent dispenser of the cleaning apparatus arranged in accordance with the present disclosure.

The cleaning solvent dispenser comprises an inlet port 61 from which an object to be processed is introduced and a crushing unit 62 operatively communicated with the inlet port 61. The crushing unit 62 includes two ring-shaped discs 63A and 63B arranged opposite to each other. A lower disc 63B rotates at a high speed of, for example, 50-100 m/sec, while an upper disc 63A is loaded with a back pressure on its back surface by means of a plurality of springs and an air pressure. Respective opposing surfaces of the upper and lower discs 63A and 63B are mirror-finished, so that the object which is being processed can be sealed therebetween when the rotation of the lower disc 63B stops. The lower disc 63B is provided with a spiral groove and provides, a intensified pressure when rotating at a high speed, thereby generating force that extends a space between the pair of discs 63A and 63B. The particles premixed in the solvent introduced from the inlet port 61 are crushed into finer particles by these two discs 63A and 63B, and then discharged. In this way, the cleaning solvent dispenser 60 can produce dry ice particles having a size of 1-5 μm.

Figure 3:
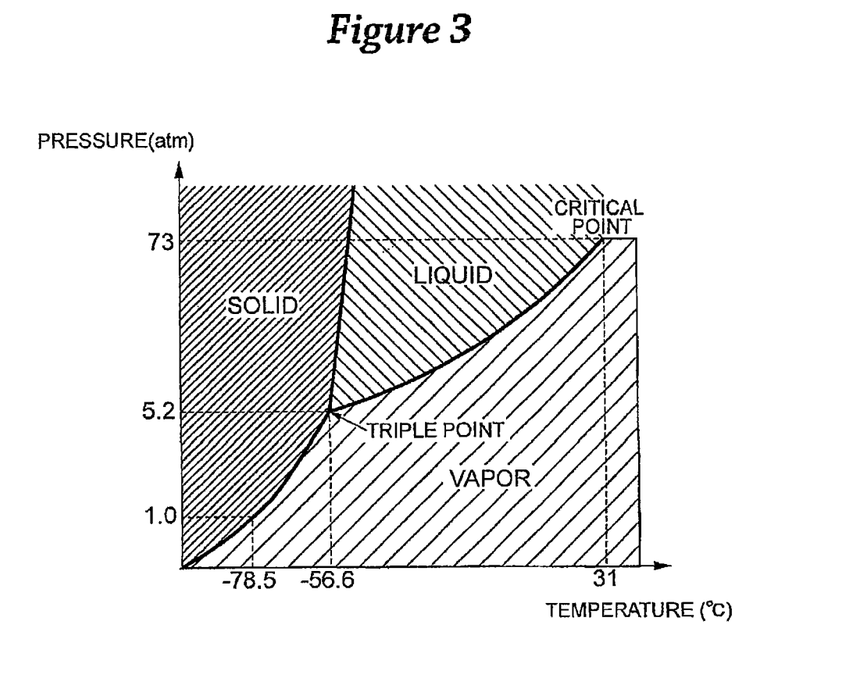
FIG. 3 is an exemplary phase graph of carbon dioxide.

Substances that are capable of sublimating at a desired temperature may be used as the particles. FIG. 3 is an example phase diagram of carbon dioxide. Phase diagrams for a wide array of materials are publicly available. At temperatures below −56.6 degrees Celsius and at pressures below 5.2 atm (the "triple point" for carbon dioxide), solid particles of carbon dioxide can sublimate directly to a gaseous state when heated, without first transitioning through a liquid state. If the solid particles were to become a liquid, the carbon dioxide may diffuse away from the article, possibly before performing any cleaning of the article. As a result, it is expected that the cleaning performance of the carbon dioxide will be superior at temperatures and pressures below the triple point. The phase diagram can also be used to obtain the sublimation temperature at a particular pressure. For example, at an ambient pressure of 1 atm, the sublimation temperature of carbon dioxide is −78.5 degrees Celsius. Cleaning performed at 1 atm pressure is expected to be superior at temperatures below this temperature, as the solid particles would sublimate directly to a gas as the temperature is increased past −78.5 degrees Celsius.

In another example, xenon in a solid phase may be used as the particles. The triple point of xenon is at a temperature of −122 degrees Celsius at a pressure of 1 atm, Xenon serving as the solvent may be easily introduced into the structure of patterns on the article as the density of xenon is relatively high (i.e., 5.9 kg/m$^3$). In another example, water in the solid phase (i.e., ice) may be used as the particles. The triple point of water is at a temperature of 0.01 degrees Celsius at a pressure of 0.06 atm. An atmospheric pressure surrounding the solvent may be depressurized below a vapor pressure of the particles.

As is anticipated from the above, it is required that the solvent have a freezing point lower than the sublimation point of the particles and have a boiling point higher than the sublimation point. Saturated aliphatic hydrocarbons such as, among others, propane, butane, pentane, and hexane, may be used as the solvent. The freezing point and the boiling point of butane at a pressure of 1 atm are −135 degrees Celsius and −0.5 degrees Celsius, respectively. For example, such a solvent with the particles of dry ice may be maintained at a temperature of about −80 degrees Celsius at a pressure of about 1 atm.

Further, the particles of carbon dioxide can absorb mainly infrared radiation, as explained above. In other words, the infrared radiation can easily cause excitation of carbon dioxide due to its energy, and accordingly the phase of the particles transfers from the solid phase to the gas phase, along with the expansion energy generated when the particles are rapidly expanded. A primary absorption wavelength of carbon dioxide is about 20 μm$^{-1}$. In contrast, saturated aliphatic hydrocarbons have absorption wavelengths which are definitely different from that of carbon dioxide, and substantially do not absorb at the same wavelength as does carbon dioxide. Thus, the energy of the infrared radiation which applies to the cleaning solvent S can selectively raise the temperature of the particles of carbon dioxide.

Figure 4:
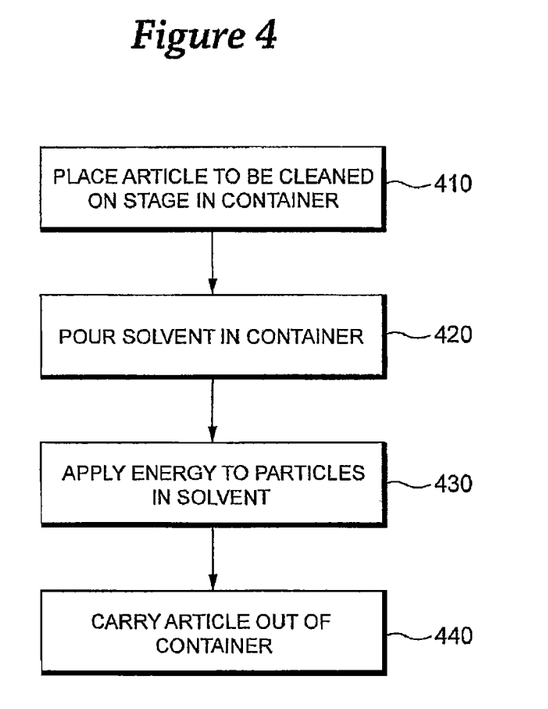
FIG. 4 is a flowchart explaining an example of a cleaning method arranged in accordance with the present disclosure.

FIG. 4 is a flowchart explaining an example of a cleaning method arranged in accordance with the present disclosure. The cleaning method may be performed by the cleaning apparatus 1 under control of the control unit 100.

Referring to FIG. 4, the control unit 100 of the cleaning apparatus 1 controls the conveying arm 30 and the movable chuck 22 to place the article A to be cleaned on the stage 21 in the container 20. Specifically, the conveying arm 30 conveys the article A to a predetermined position in the chamber 10, and then the chuck 22 picks up the article A and moves vertically down to the stage 21 (block 410). The control unit 100 then controls the cleaning solvent dispenser 60 to provide the solvent with the nanometer-sized particles dispersed therein in the container 20 (block 420). It should be understood that the solvent with the particles dispersed therein may be provided in the container 20 first, and thereafter the article A may be placed on the stage 21 in the solvent in the container 20.

The control unit 100 then controls the energy generator 50 to apply external energy to the particles dispersed in the solvent to cause the particles to sublimate (block 430). The energy may be applied continuously or intermittently for a predetermined period of time, Such an operation causes the temperatures of the solvent and particles to rise rapidly and thus creates numerous nanobubbles, and the pressure, flow and buoyancy of the bubbles remove contamination on the surface of the article A. After the nanobubble creation process, the control unit 100 controls the chuck 22 and the conveying arm 30 to carry the article A out of the chamber 10 (block 440).

FIGS. 5A and 5B, and FIGS. 6A-6D are schematic illustrations explaining cleaning action in the cleaning method performed by the cleaning apparatus 1 arranged in accordance with the present disclosure.

Figure 5A:
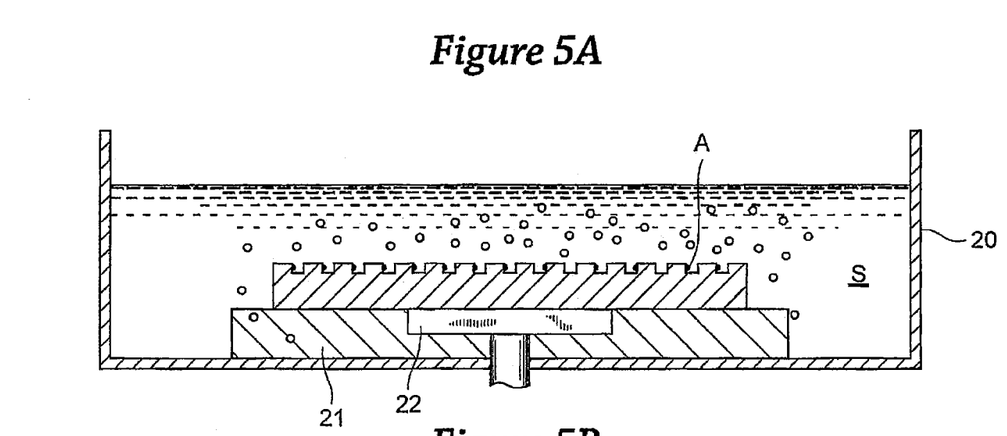
FIGS. 5A and 5B are schematic illustrations explaining cleaning action in a cleaning method arranged in accordance with the present disclosure.
Figure 5B:
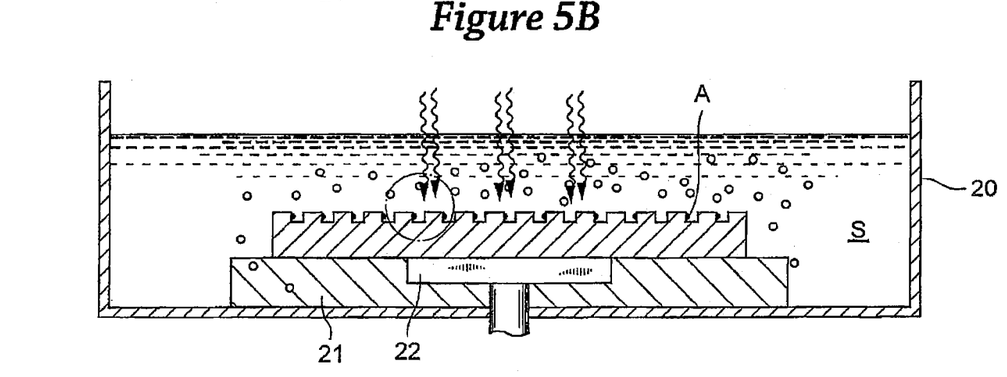

As shown in FIG. 5, the article A to be cleaned is placed on the stage 21, being submerged in the cleaning solvent S in the container 20. As explained above, the cleaning solvent S comprises liquid butane serving as a solvent with nanometer-sized particles P of dry ice dispersed therein, the cleaning solvent S being maintained at a temperature of about −80 degrees Celsius. In this state, thermal energy is applied to the article A, as shown in FIG. 5B.

Figure 6A:
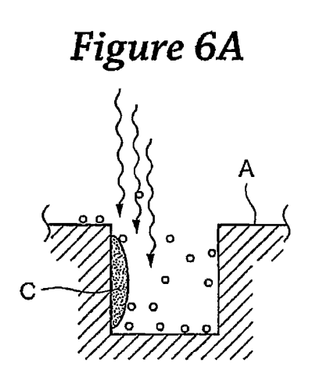
FIGS. 6A-6D are partial cross-sectional views of an article as explained in FIGS. 5A and 5B.

Specifically, FIG. 6A illustrates a partial cross-sectional view of the structure of a certain pattern of the article A. Contamination or an unwanted material C adheres to the groove-like structure on the surface of the article A. Since the density of dry ice is higher than that of liquid butane, some of the nanometer-sized particles may be introduced into the groove-like structure.

Figure 6B:
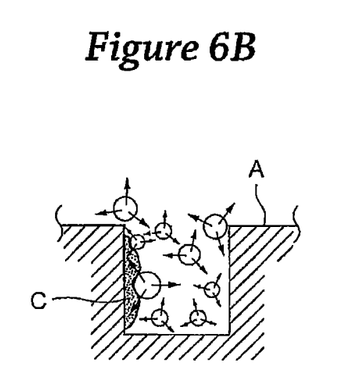
Figure 6C:
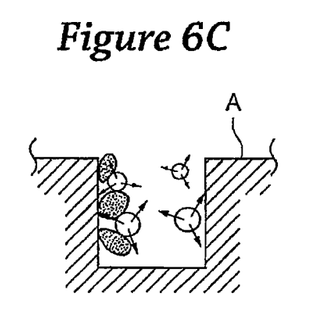
Figure 6D:
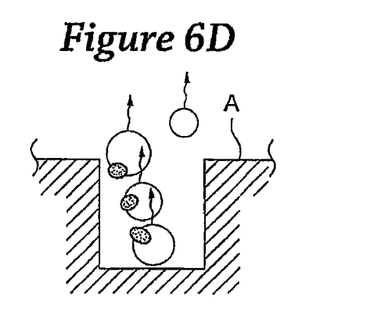

When external energy is applied to the article A, the temperature of the particles rises and the sublimation of the particles occurs (FIG. 6B). Accordingly, since the phase of the particles transfers from the solid phase to the gas phase, the volume thereof rapidly expands, and the expansion energy at this time removes the contamination adhering to the article A (FIG. 6C). The removed contamination is guided out of the groove by the buoyancy of the bubbles (FIG. 6D).

Figure 7:
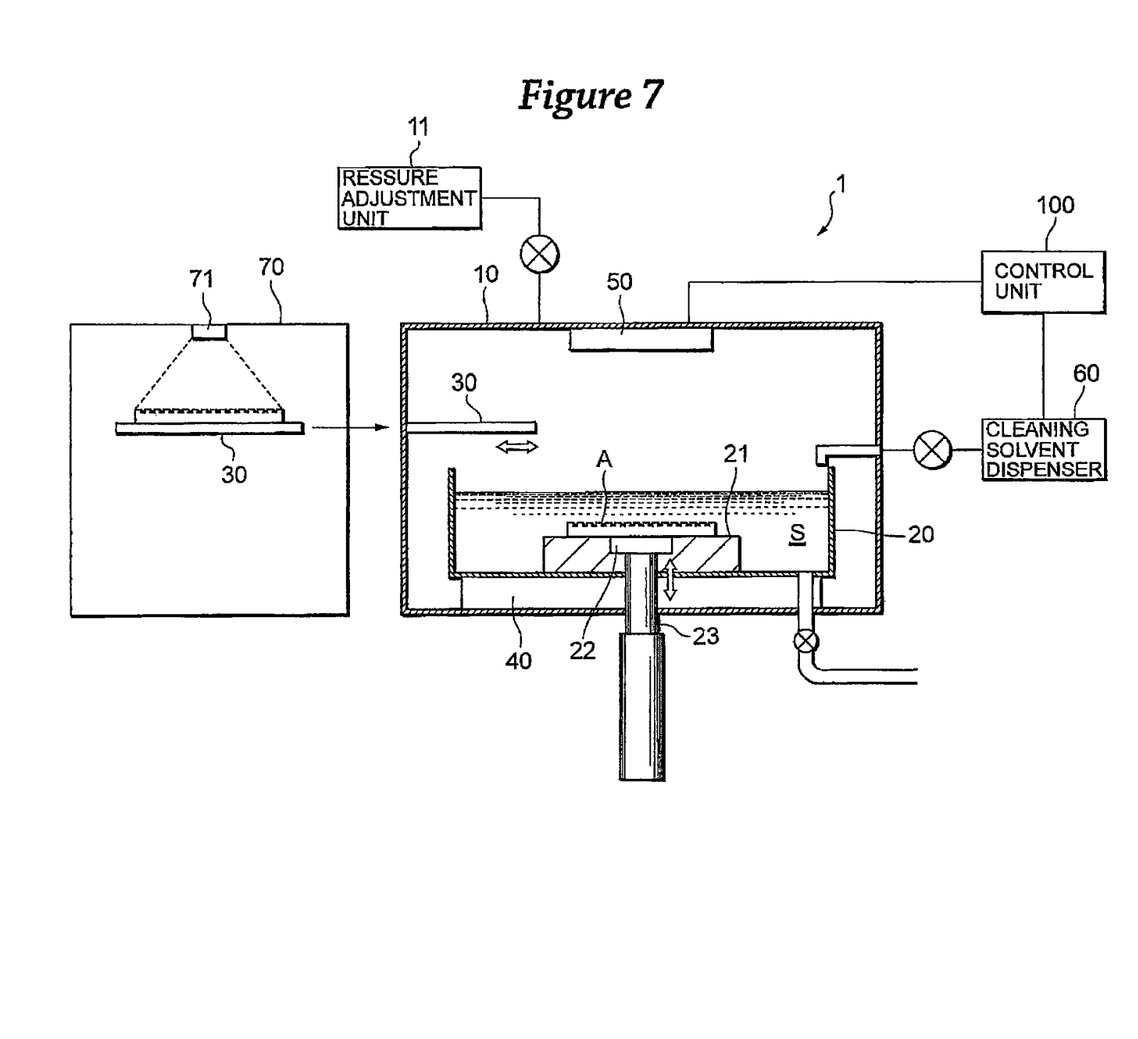
FIG. 7 is a schematic illustration of another example of a cleaning apparatus arranged in accordance with the present disclosure.

FIG. 7 is a schematic illustration of an another example of a cleaning apparatus 1 arranged in accordance with the present disclosure. In FIG. 6, the cleaning apparatus 1 is shown as including an inspection apparatus 70.

The inspection apparatus 70 comprises a detection device 71 for detecting contamination on a surface of the article A. The detection device 71 scans the surface of the article A, which has been divided into regions in a grid for contamination detection, and detects contamination, if any, for each region. The result of the contamination detection by the detection device 71 is represented as profile information and transmitted to the control unit 100.

Figure 8:
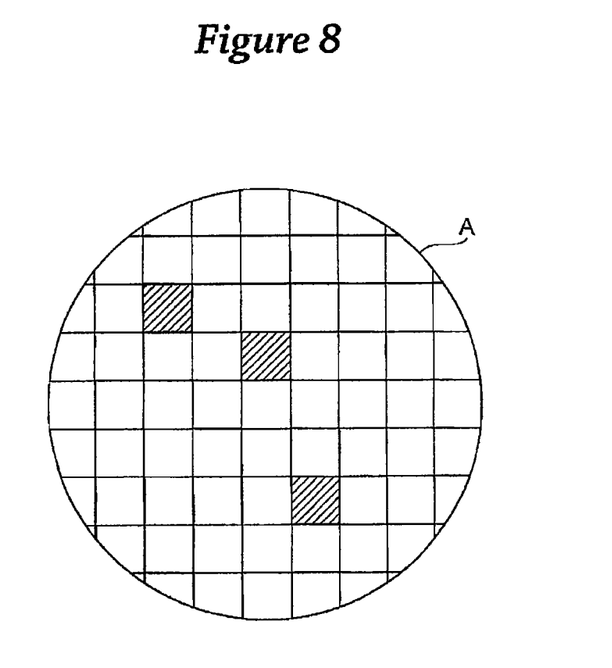
FIG. 8 is a schematic illustration explaining profile information of an article detected by a detection device arranged in accordance with the present disclosure.

FIG. 8 is a schematic illustration explaining the profile information of the article A detected by the detection device 71 arranged in accordance with the present disclosure.

As shown in FIG. 8, the profile information represents the presence/absence of contamination in each region into which the surface of the article A has been geometrically divided. In other words, the profile information represents the position of contamination on the surface of the article A. In this example, the profile information indicates that contamination is present in three regions on the surface of the article A.

The control unit 100 controls the energy generator 50 based on the profile information transmitted from the inspection apparatus 70. Specifically, the control unit 100 controls the energy generator 50 so as to selectively apply thermal energy to the regions where the contamination has been detected. With such an operation, time and energy required for cleaning can be reduced.

Figure 9:
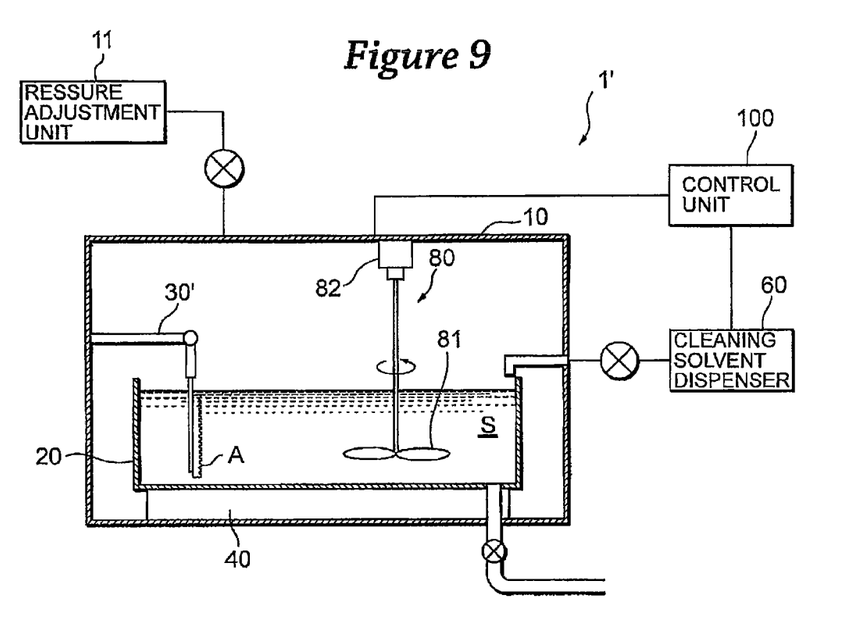
FIG. 9 is a schematic illustration of another example of a cleaning apparatus arranged in accordance with the present disclosure.

FIG. 9 is a schematic illustration of another example of a cleaning apparatus arranged in accordance with the present disclosure. In the example of FIG. 9, a cleaning apparatus 1' is shown as including a flow generator 80 configured to generate a liquid flow of the cleaning solvent S toward the article A in the container 20. The cleaning apparatus 1' allows the particles in a solid phase to sublimate by collision energy of the particles colliding against the surface on the article A.

Specifically, the flow generator 80 may comprise an agitator blade 81 and a motor 82 configured to rotate the agitator blade 81. The motor 82 may be driven by the control unit 100. The speed of the liquid flow generated by the agitator blade 81 may be selected so as to produce the collision energy sufficient to sublimate the particles. The article A may be placed in the container 20 such that a surface to be cleaned of the article can effectively receive the liquid flow of the cleaning solvent. In view of this, a conveying arm 30' shown in FIG. 8 may comprise, but not limited to, a robot arm including joints allowing rotational motion and linear displacement.

FIGS. 10A-10D are schematic illustrations explaining cleaning action in the cleaning method performed by the cleaning apparatus 1' arranged in accordance with the present disclosure.

Figure 10A:
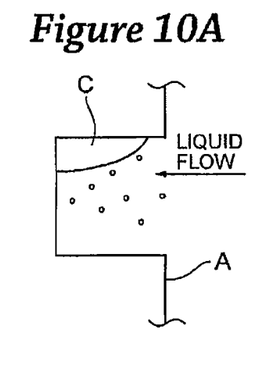
FIGS. 10A-10D are schematic illustrations explaining cleaning action in a cleaning method arranged in accordance with the present disclosure.
Figure 10B:
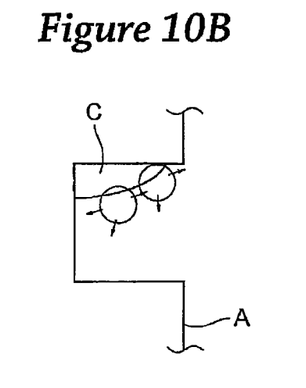
Figure 10C:
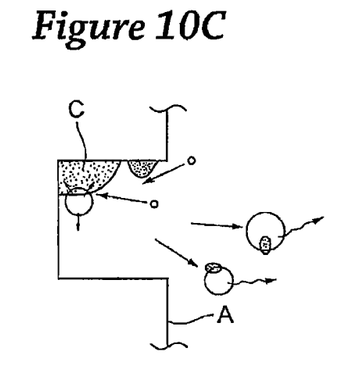
Figure 10D:
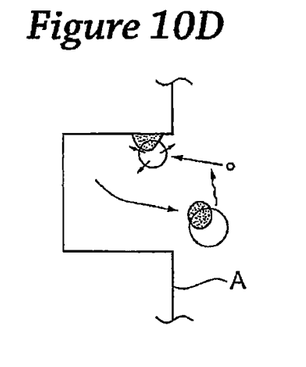

In FIG. 10A, contamination or an unwanted material C adheres to the groove-like structure on the surface of the article A. When the cleaning solvent S is agitated, a liquid flow of the cleaning solvent S is generated. Some of the particles are guided by the liquid flow toward the article A, collide against the surface of the article A, and the temperature of these particles rise due to the collision energy, which causes the particles to sublimate (FIG. 10B). Accordingly, since the phase of the particles transfer from the solid phase to the gas phase, the volume thereof expands rapidly, and the expansion energy removes the contamination adhering to the article A (FIG. 10C). Then, the removed contamination is guided out of the groove by the buoyancy of the bubbles (FIG. 10D)

The technique in the present disclosure can be used for cleaning devices having nanostructures, such as semiconductor devices, MEMS devices and nanoimprint templates. In addition, this technique can be used in combination with conventional cleaning methods that use acid and alkali solutions as well as organic solvents.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

The invention claimed is:

1. A cleaning agent comprising:
   a solvent;
   one or more particles disposed in the solvent, the one or more particles comprising at least one of solid-phase carbon dioxide or solid-phase xenon, wherein the one or more particles have a sublimation point;
   wherein the solvent has a freezing point lower than the sublimation point of the one or more particles, and wherein the solvent has a boiling point higher than the sublimation point of the one or more particles.

2. The cleaning agent of claim 1, wherein the solvent comprises at least one saturated aliphatic hydrocarbon.

3. The cleaning agent of claim 2, wherein the at least one saturated aliphatic hydrocarbon comprises at least one of liquid-phase propane, liquid-phase butane, liquid-phase pentane, and liquid-phase hexane.

4. The cleaning agent of claim 1, wherein the one or more particles have a diameter of approximately one nanometer.

5. The cleaning agent of claim 1, wherein the one or more particles comprises nanoparticulated dry ice.

6. The cleaning agent of claim 1, wherein the cleaning agent is configured to be used at a temperature less than a temperature of the sublimation point of the one or more particles.

7. The cleaning agent of claim 1, wherein the cleaning agent is configured to be used at a temperature less than or equal to −78.5° C. and at an atmospheric pressure of about 1.

8. The cleaning agent of claim 1, wherein the cleaning agent is configured to be used at a temperature less than or equal to −122° C. and at an atmospheric pressure of about 1.

9. A cleaning agent comprising:
 a solvent comprising at least one saturated aliphatic hydrocarbon, the solvent having a plurality of particles disposed therein, the plurality of particles comprising at least one of solid-phase carbon dioxide and solid-phase xenon, wherein the plurality of particles have a sublimation point and a diameter of approximately one nanometer;
 wherein the solvent has a freezing point lower than the sublimation point of the plurality of particles, and wherein the solvent has a boiling point higher than the sublimation point of the plurality of particles.

10. The cleaning agent of claim 9, wherein the at least one saturated aliphatic hydrocarbon comprises at least one of liquid-phase propane, liquid-phase butane, liquid-phase pentane, and liquid-phase hexane.

11. The cleaning agent of claim 9, wherein the plurality of particles comprises nanoparticulated dry ice.

12. The cleaning agent of claim 9, wherein the cleaning agent is configured to be used at a temperature less than a temperature of the sublimation point of the one or more particles.

13. The cleaning agent of claim 9, wherein the cleaning agent is configured to be used at a temperature less than or equal to −78.5° C. and at an atmospheric pressure of about 1.

14. The cleaning agent of claim 9, wherein the cleaning agent is configured to be used at a temperature less than or equal to −122° C. and at an atmospheric pressure of about 1.

* * * * *

UNITED STATES PATENT AND TRADEMARK OFFICE
CERTIFICATE OF CORRECTION

| | | |
|---|---|---|
| PATENT NO. | : 8,530,402 B2 | Page 1 of 1 |
| APPLICATION NO. | : 13/445254 | |
| DATED | : September 10, 2013 | |
| INVENTOR(S) | : Kusuura | |

It is certified that error appears in the above-identified patent and that said Letters Patent is hereby corrected as shown below:

In the Drawings

In Fig. 1, Sheet 1 of 10, for Tag "11", in Line 1, delete "RESSURE" and insert -- PRESSURE --, therefor.

In Fig. 7, Sheet 7 of 10, for Tag "11", in Line 1, delete "RESSURE" and insert -- PRESSURE --, therefor.

In Fig. 9, Sheet 9 of 10, for Tag "11", in Line 1, delete "RESSURE" and insert -- PRESSURE --, therefor.

In the Specification

In Column 1, Line 4, delete "This is" and insert -- This --, therefor.

In Column 3, Line 18, delete "not" and insert -- not absorb --, therefor.

In Column 3, Line 53, delete "a intensified" and insert -- an intensified --, therefor.

In Column 4, Line 17, delete "atm," and insert -- atm. --, therefor.

In Column 5, Line 5, delete "time," and insert -- time. --, therefor.

In Column 6, Line 40, delete "10D)" and insert -- 10D). --, therefor.

In the Claims

In Column 6, Line 60, in Claim 1, delete "carbon dioxide or solid-phase xenon," and insert -- carbon dioxide and solid-phase xenon, --, therefor.

Signed and Sealed this
Eighth Day of April, 2014

Michelle K. Lee
*Deputy Director of the United States Patent and Trademark Office*